(12) United States Patent
Droz

(10) Patent No.: US 8,993,045 B2
(45) Date of Patent: Mar. 31, 2015

(54) METHOD OF MANUFACTURING CARDS THAT INCLUDE AT LEAST ONE ELECTRONIC UNIT

(75) Inventor: François Droz, Corcelles (CH)

(73) Assignee: NagraID S.A., La Chaux-de-Fonds (CH)

( * ) Notice: Subject to any disclaimer, the term of this patent is extended or adjusted under 35 U.S.C. 154(b) by 529 days.

(21) Appl. No.: 12/666,992

(22) PCT Filed: Jun. 11, 2008

(86) PCT No.: PCT/EP2008/057320
§ 371 (c)(1),
(2), (4) Date: Dec. 28, 2009

(87) PCT Pub. No.: WO2009/000653
PCT Pub. Date: Dec. 31, 2008

(65) Prior Publication Data
US 2010/0196593 A1    Aug. 5, 2010

(30) Foreign Application Priority Data

Jun. 26, 2007   (EP) .................................... 07111079

(51) Int. Cl.
*B05D 5/12*       (2006.01)
*G06K 19/077*    (2006.01)
*B05D 1/02*       (2006.01)
*C23C 14/00*     (2006.01)
*C23C 16/00*     (2006.01)
(Continued)

(52) U.S. Cl.
CPC ............. *G06K 19/077* (2013.01); *C23C 14/00* (2013.01); *C23C 16/00* (2013.01); *B05D 5/12* (2013.01); *B05D 1/40* (2013.01); *B05D 1/02* (2013.01); *B05D 1/26* (2013.01); *G06K 19/07718* (2013.01)

USPC ........ 427/96.4; 427/98.4; 427/99.2; 427/355; 427/356; 427/359

(58) Field of Classification Search
USPC ............... 427/96.4, 98.4, 99.2, 355, 356, 359
See application file for complete search history.

(56) References Cited

U.S. PATENT DOCUMENTS 4,470,858 A *  9/1984  McMaster ...................... 156/103
4,995,333 A    2/1991  Keller et al.
(Continued)

FOREIGN PATENT DOCUMENTS

| EP | 0 570 784 A1 | 11/1993 |
| EP | 0 720 123 A2 | 7/1996 |
| EP | 1 244 055 A2 | 9/2002 |

OTHER PUBLICATIONS

International Search Report issued in corresponding application No. PCT/EP2008/057320, completed Oct. 21, 2008 and mailed Oct. 29, 2008.

(Continued)

*Primary Examiner* — Brian K Talbot
(74) *Attorney, Agent, or Firm* — Griffin & Szipl, P.C.

(57) ABSTRACT

The invention relates to a method for manufacturing boards that comprises depositing a liquid resin (22) on and/or under a plurality of electronic units for forming a plate defining a plurality of boards or board bodies. In order to do so, and in order to reduce as much as possible the residual air bubbles in the manufactured plate, the method comprises depositing the resin in the form of resin beads (26) initially having between them grooves (28) defining air discharge channels. The resin in uniformly spread using a pressing roller for one end of the plate to a second opposite end of the plate.

3 Claims, 4 Drawing Sheets

(51) Int. Cl.
*B05D 1/40* (2006.01)
*B05D 1/26* (2006.01)

(56) References Cited

U.S. PATENT DOCUMENTS

| | | | | |
|---|---|---|---|---|
| 5,266,349 | A | * | 11/1993 | Bok .................................... 427/8 |
| 5,409,733 | A | * | 4/1995 | Boger et al. .................. 427/96.4 |
| 5,922,402 | A | * | 7/1999 | Speeney .................... 427/208.6 |
| 7,028,867 | B2 | | 4/2006 | Acum et al. |
| 2002/0129970 | A1 | * | 9/2002 | Murohara ..................... 174/255 |
| 2004/0217202 | A1 | * | 11/2004 | Hynes ........................... 239/380 |
| 2005/0179122 | A1 | | 8/2005 | Okawa et al. |
| 2006/0191711 | A1 | * | 8/2006 | Cho et al. ...................... 174/260 |
| 2008/0166490 | A1 | * | 7/2008 | Hogan et al. .................. 427/422 |

OTHER PUBLICATIONS

U.S. Appl. No. 60/884,030, filed Jan. 9, 2007.

* cited by examiner

METHOD OF MANUFACTURING CARDS THAT INCLUDE AT LEAST ONE ELECTRONIC UNIT

This is a National Phase Application in the United States of International Patent Application No. PCT/EP2008/057320 filed Jun. 11, 2008, which claims priority on European Patent Application No. 07111079.5, filed Jun. 26, 2007. The entire disclosures of the above patent applications are hereby incorporated by reference.

FIELD OF THE INVENTION

The present invention concerns a method of manufacturing cards that each includes at least one electronic unit, in particular an electronic unit including an electronic display. The card obtained from the method according to the invention is for example a bank card, in particular conforming to the corresponding ISO standard. However, the present invention may also apply to other types of electronic cards with various profiles, particularly circular profiles.

BACKGROUND OF THE INVENTION

In particular, the card manufacturing method according to the invention proposes making a plurality of cards or card bodies in the form of a plate from which each card or card body is then cut out. The plate is formed by a plurality of electronic units and a resin that at least partially coats or embeds the electronic units. In order to do this, the method includes a step of placing a resin in liquid form on and/or underneath the plurality of electronic units.

EP Patent No. 0 570 784 discloses in one particular implementation, a method of manufacturing cards that include an electronic assembly, in particular a transponder, which is placed in a main aperture in a positioning frame. The transponder and the positioning frame are embedded in a binder that can be added in viscous liquid form, particularly a resin. The positioning frame in EP Patent No. 0 570 784 is used only for delimiting an internal area for the transponder, formed of an integrated circuit and a coil, inside the card. Thus, when pressure is applied on the various elements and the binder to form a card, the transponder is held in an inner area of each card, while the binder can extend to form a layer that passes across the cards. Those skilled in the art can thus find in this Patent a card manufacturing method that allows transponders or other electronic units of various and even complex shapes to be integrated in the cards. However, providing and depositing the resin and on and/or underneath the electronic units and the positioning frame is a difficult step, especially when the electronic unit has a complex shape of variable thickness.

It is an object of the present invention to propose an improved manufacturing method for reducing the presence of residual air bubbles in the manufactured cards by providing resin in viscous liquid form. It is another object to improve the flatness of the cards obtained.

SUMMARY OF THE INVENTION

Thus, in a first implementation, the card manufacturing method according to the invention includes a step of feeding at least one part of the resin in liquid form onto a plurality of electronic units and it is characterized in that:

the at least one part of the resin is deposited on the plurality of electronic units by means of a plurality of nozzles in a resin feed installation, the installation being arranged such that the plurality of nozzles and the plurality of electronic units brought into the installation can have a relative movement between them along a direction that has at least one horizontal component;

during the deposition of the at least one part of the resin, the plurality of nozzles undergoes a movement relative to the plurality of electronic units along the direction so as to generate strings of resin oriented in this direction on the plurality of electronic units and, which initially have grooves between them; and the deposited resin is then gradually extended along the direction by means for spreading out the resin, the plurality of electronic units and the spreading means having a relative movement between them along the direction.

A second implementation of the method according to the invention includes a step of providing at least one part of the resin in liquid form underneath the plurality of electronic units, the method being characterized in that:

the at least one part of the resin is deposited on any sheet or layer, above which the plurality of electronic units are then arranged, by means of a plurality of nozzles in a resin feed installation, the installation being arranged such that the plurality of nozzles and the sheet or layer brought into the station can have a relative movement between them along a first direction, approximately parallel to the sheet or layer in the resin deposition area;

when the at least one part of the resin is deposited on the sheet or layer, the plurality of nozzles undergoes a movement relative to the sheet or layer along the first direction so as to generate strings of resin oriented along the first direction and initially having grooves between them; and the plurality of electronic units is placed on the strings of resin.

It will be noted that the sheet or layer may be a layer of manufactured cards or a work sheet that will be removed during manufacture of the cards or prior to the cards being used.

A preferred variant of this second implementation of the invention also includes placing a second part of the liquid resin on the plurality of electronic units in a similar way to the aforementioned first implementation. In particular, the viscosity of the resin part initially placed on the sheet or layer and the addition of the plurality of electronic units may be provided such that the means for spreading the second resin part deposited on the plurality of electronic units are also used for spreading the first resin part, at least in a final phase of spreading the first resin part directly deposited on the sheet or layer. In such case, the orientation of the first resin strings initially deposited on the sheet or layer is preferably approximately the same as the orientation of the second resin strings that are subsequently deposited on the plurality of electronic units.

In accordance with a first non-limiting embodiment of the present invention, a card manufacturing method is provided wherein a plurality of cards or card bodies are made in the form of a plate or strip that includes a plurality of electronic units and a resin that at least partially coats the electronic units, wherein each card or card body is eventually cut out of the plate or strip, and wherein the method includes a step of providing at least one part of the resin in liquid form over the plurality of electronic units, and is characterized in that: (a) the at least one part of the resin is deposited over the plurality of electronic units by means of a plurality of nozzles in a resin feed installation, wherein the installation is arranged such that there can be a relative movement between the plurality of nozzles and the plurality of electronic units brought into the installation along a direction that has at least one horizontal component; (b) during the deposition of the at least one part of the resin, the plurality of nozzles undergoes a movement relative to the plurality of electronic units along the direction so as to generate strings of resin on the plurality of electronic units, wherein the strings are oriented along the direction and initially have grooves between them; and (c) the deposited resin is gradually spread out along the direction by means for spreading the resin, and there is a relative movement between the plurality of electronic units and the spreading means along the direction.

In accordance with a second non-limiting embodiment of the present invention, a card manufacturing method wherein a plurality of cards or card bodies are made in the form of a plate or strip including a plurality of electronic units and a resin that at least partially coats the electronic units, wherein each card or card body is eventually cut out of the plate or strip, and wherein the method has a step of providing at least one part of the resin in liquid form underneath the plurality of electronic units, and is characterized in that: (a) at least one part of the resin is deposited on a sheet or layer, above which the plurality of electronic units is then arranged, by means of a plurality of nozzles in a resin feed installation, wherein the installation is arranged such that there is a relative movement between the plurality of nozzles and the sheet or layer brought into the installation along a first direction that is approximately parallel to the sheet or layer in the resin deposition area; (b) during the deposition of the at least one part of the resin on the sheet or layer, the plurality of nozzles undergoes a movement relative to the sheet or layer along the first direction so as to generate strings of resin, which are oriented along the first direction and initially have grooves between them; and (c) the plurality of electronic units is placed on the strings of resin. In accordance with a third non-limiting embodiment of the present invention, the second non-limiting embodiment is modified so that a second part of the resin is also provided in liquid form on the plurality of electronic units, and the method is characterized in that: the second part of the resin is deposited on the plurality of electronic units by means of a plurality of nozzles in a resin feed installation, wherein the installation is arranged such that there is a relative movement between the plurality of nozzles and the plurality of electronic units brought into the installation along a second direction approximately parallel to the sheet or layer in the deposition area of the second part of the resin; and during the deposition of the second part of the resin on the plurality of electronic units, the plurality of nozzles undergoes a movement relative to the plurality of electronic units along the second direction so as to generate, on the plurality of electronic units, resin strings, which are oriented along the second direction and initially have grooves between them; and the second part of the resin deposited on the plurality of electronic units is then gradually spread out along the second direction by means for spreading the second part of the resin, and there is a relative movement between the plurality of electronic units and the spreading means along the second direction.

In accordance with a fourth non-limiting embodiment of the invention, the third non-limiting embodiment is further modified so that the second direction is parallel to the first direction. In accordance with a fifth non-limiting embodiment of the present invention, the fourth non-limiting embodiment is further modified so that the means for spreading the second part of the resin are also used for spreading the resin part deposited on the sheet or layer, at least in an end phase of spreading the resin part.

In accordance with a sixth non-limiting embodiment of the present invention, the first, second, third, fourth, and fifth non-limiting embodiments are further modified so that the spacing between the deposited resin strings is variable. In accordance with a seventh non-limiting embodiment of the present invention, the first, second, third, fourth, fifth, and sixth non-limiting embodiments are further modified so that the widths of the deposited resin strings are variable. In accordance with an eighth non-limiting embodiment of the present invention, the first, second, third, fourth, fifth, sixth and seventh non-limiting embodiments are further modified so that resin strings are each deposited over a certain length, with at least two resin strings having different lengths. In accordance with a ninth non-limiting embodiment of the present invention, the first, second, third, fourth, fifth, sixth, seventh, and eighth non-limiting embodiments are further modified so that a structure that has a plurality of apertures is also provided, and in that the plurality of electronic units is arranged in the plurality of apertures of the structure.

Owing to the features of the card manufacturing method according to the invention, the grooves initially present between the deposited resin strings allow air to escape easily when a press device belonging to the spreading means is actuated to gradually press on the resin along the direction defined by the deposited resin strings. The resin is thus gradually spread out along the direction of orientation of the resin strings. Thus, the air momentarily enclosed by the resin is pushed forwards by the spreading means, and the air easily makes its way to the grooves that are still present upstream of the spreading means. These grooves, arranged between the resin strings, define residual air evacuation channels and prevent residual air bubbles from remaining enclosed in the resin and eventually in the card body formed by the resin.

BRIEF DESCRIPTION OF THE DRAWINGS

The present invention will be explained below in more detail via the following description, made with reference to the annexed drawings, given by way of non-limiting examples, in which.

DETAILED DESCRIPTION OF THE ILLUSTRATIVE EMBODIMENTS

Figure 1:
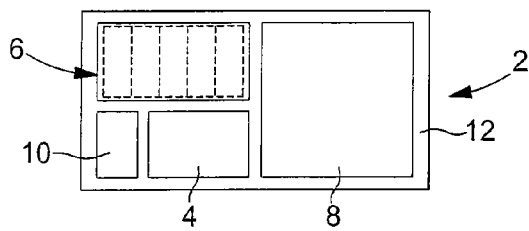
FIG. 1 shows schematically an electronic unit that can be incorporated in an electronic card according to the invention.
Figure 2:
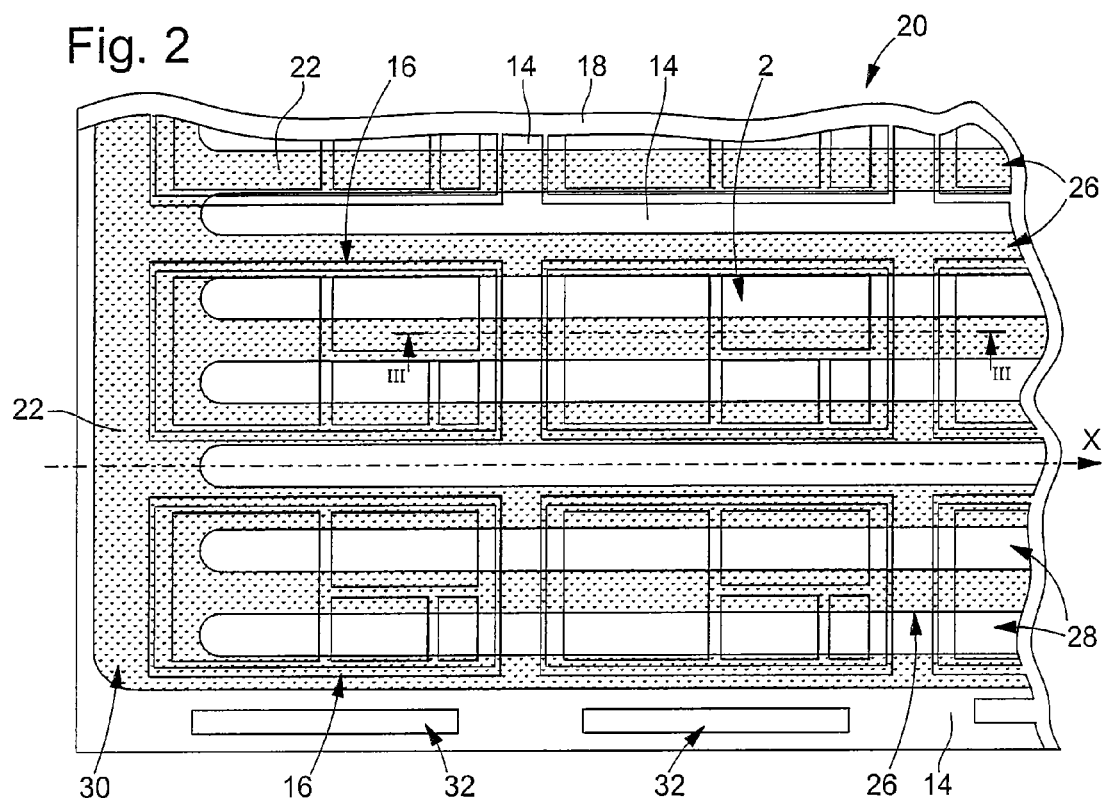
FIG. 2 is a partial top view showing the resin deposited on a plurality of electronic units according to a first implementation of the method of the invention.
Figure 3:
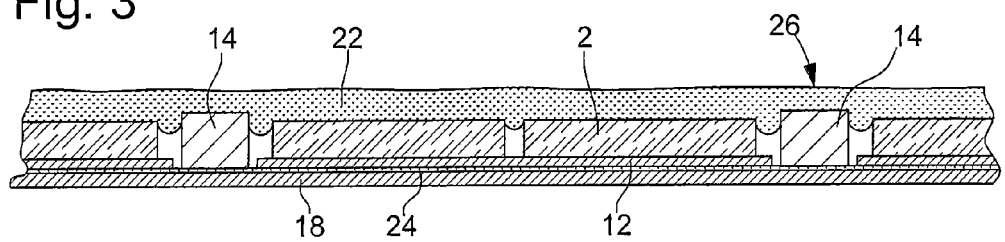
FIG. 3 is a schematic cross-section along the line III-III of FIG. 2.

FIG. 1 shows schematically, by way of non-limiting example, an electronic unit 2 that includes an integrated circuit 4, an electronic display 6, a battery 8 and a switch 10, which are arranged on a support 12. This electronic unit has a complex shape of varying thickness and slots or free spaces between the various elements.

With reference to FIGS. 2 to 6, a first implementation of the card manufacturing method according to the invention will be described below. Several electronic units 2 are arranged respectively in several apertures 16 of a pierced structure 14. Structure 14 and units 2 are bonded onto a sheet 18, which has a film of adhesive 24 at its surface. These various elements form a prefabricated assembly 20, which is brought into an installation for depositing a liquid resin 22. This resin 22 is provided to fill the remaining spaces in apertures 16 and to cover pierced structure 14 and the plurality of electronic units 2. Hereafter, this pierced structure is also called a plate or pierced plate.

According to the invention, resin 22 is deposited on assembly 20 by means of a plurality of nozzles (not shown). These nozzles are arranged, for example, in a line on a suitable support. The resin can be fed to each nozzle individually or the plurality of nozzles can have a common feed, particularly by using a pipe on which the nozzles are mounted. Those skilled in the art have several possibilities for making this resin deposition installation. The resin deposition installation is arranged such that the plurality of nozzles and the plurality of electronic units brought into the installation can have a relative movement between them along a direction X in the general plane of assembly 20 that corresponds to the general plane of FIG. 2. Thus, when resin 22 is deposited on assembly 20, the plurality of nozzles undergoes a movement relative to assembly 20 so that the resin is deposited in the form of resin strings 26, which initially have grooves 28 between them. These grooves 28 define air evacuation channels (air discharge channels) located in the remaining spaces in apertures 16 of plate 14.

At the end of the plate where the resin deposition starts, it is possible to remain in a stationary position for a short period or to initially move the nozzles transversely to the relative direction of movement used to form strings 26. A continuous area of resin 30 is thus obtained at that end of assembly 20. This enables a small reserve of resin to be obtained to ensure that filling is properly performed from the very first row of apertures 16. On the edges of plate 14 there are apertures 32 forming small tanks for recovering resin during the step in which the resin is spread by spreading means provided for that purpose. This latter step will be described below with reference to FIGS. 4 and 5.

Figure 4:
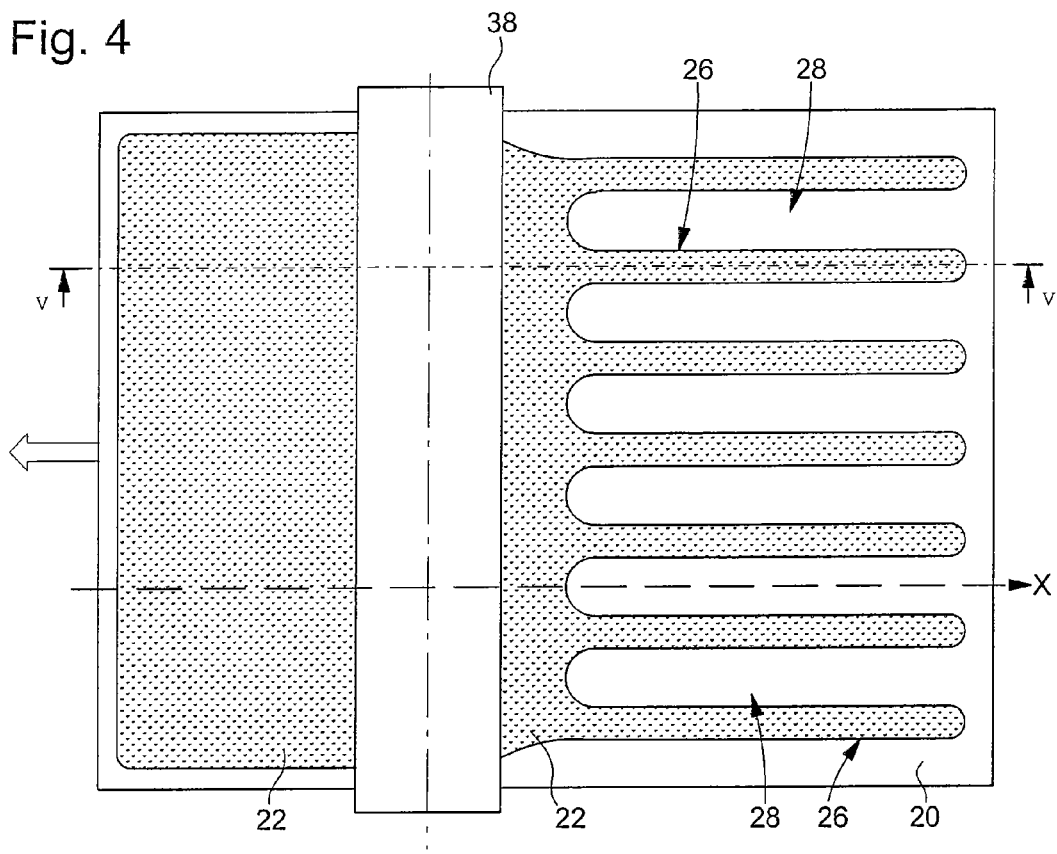
FIG. 4 is a schematic top view showing a press roller that spreads the deposited resin strings in accordance with a feature of the method of the invention.

A top sheet 34 is placed on assembly 20 and resin 22 (this sheet is transparent in FIG. 4 in order to show resin 22). To simplify the drawing in FIG. 4, only the exterior outline of assembly 20 has been shown. Assembly 20 resin 22 and top sheet 34 are placed on a flat support 36, in particular on a work table or any flat surface arranged in the installation used for spreading the resin to form a solid and approximately flat plate. A press roller 38 together with support 36 forms the resin spreading means. The installation is provided such that assembly 20, which includes the plurality of electronic units, and press roller 38 have between them a relative movement along direction X defined by resin strings 26. Press roller 38 is preferably positioned at one end of assembly 20, in particular behind the continuous resin area 30. Next, the roller moves gradually forwards pressing on the resin via top sheet 34 so as to fill the remaining spaces in apertures 16 and to cover units 2. FIG. 4 shows the stationary press roller with assembly 20 and resin 22 undergoing a movement along direction X, in the backwards direction, such that press roller 38 has a forward movement relative to assembly 20. This is thus equivalent to the diagram in FIG. 5 where assembly 20 remains stationary while press roller 38 is moved along direction X while maintaining a constant distance from support 36.

It will be noted here that other press devices may be provided. In particular, an efficient installation is fitted with pairs of press rollers between which the elements and the resin forming the cards or card bodies are introduced. Preferably, these elements and the resin are drawn between the rollers, which are freely mounted on their respective axes of rotation. To do this, assembly 20 and/or the sheets 18/34 are gripped using gripping means. Each bottom roller is preferably arranged in a working plane the surface of which, at least in proximity to the roller, is located approximately on the top line of the cylindrical surface of the roller.

Advantageously, pressure is applied from one end of assembly 20 to a second opposite end of the assembly along direction X defined by resin strings 26. Apertures 16 are thus gradually filled and the residual air can easily escape through the remaining grooves 28, defining air discharge channels, at least partially ahead of roller press 38. Indeed, even if the grooves are already partially closed because resin strings 26 have spread transversely, particularly under the weight of sheet 34 placed on the strings, some residual air bubble evacuation efficiency remains.

It will be noted that the present invention applies in a similar manner if there is no pierced plate 14 provided, but simply a plurality of electronic units 2. The method according to the invention also applies in the absence of external sheets or layers 16 and 34. In a simple variant, there may thus only be a plurality of electronic units placed on a working surface and the resin deposited in accordance with the method of the invention, i.e. with the resin deposited in the form of strings that at least initially have grooves between them. The electronic units may be added prior to the resin deposition or simultaneously therewith in a continuous card or card body manufacturing method, wherein the electronic cards are placed upstream of the resin deposition area relative to the direction of movement of the continuous method. It will also be noted that the pierced plate may be a pierced strip, which is continuously unrolled and provided either with the electronic units or individually.

In the first implementation described here, the various elements are placed on a support or work surface 36. This support may be mobile or stationary. It can have a top belt that can undergo a movement along axis X. In another variant, the assembly of elements may be drawn by means for gripping the assembly, and then passed between two press rollers, which may be freely mounted on their axis of rotation.

Figure 6:
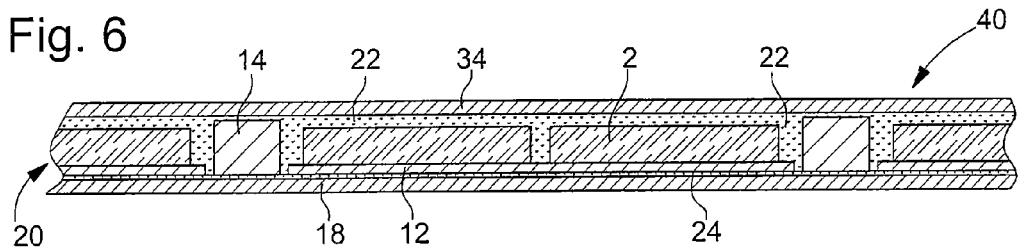
FIG. 6 is a partial cross-section of a plate forming a plurality of cards obtained in accordance with the method disclosed with reference to the preceding Figures.
Figure 7:
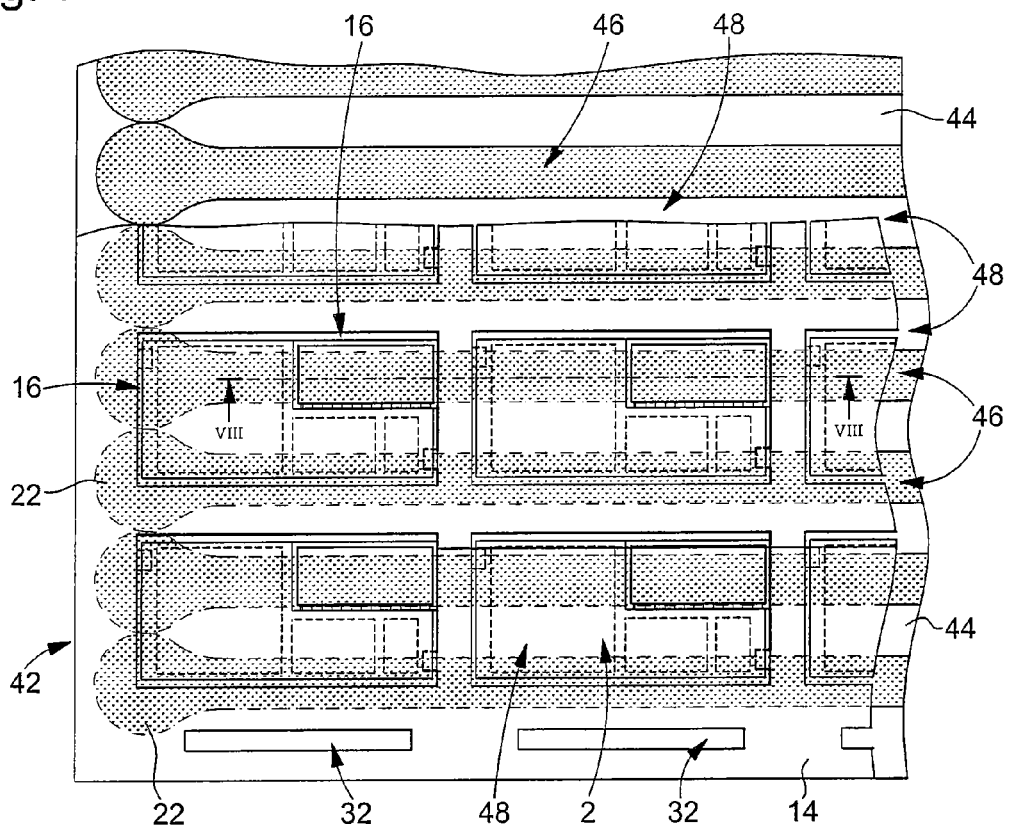
FIG. 7 is a partial top view schematically showing a second implementation of the method according to the invention.

FIG. 6 shows the plate 40 obtained by the aforementioned method. It defines a plurality of cards or card bodies. In the central area of the plate there is a layer formed by resin 22, which covers and laterally surrounds pierced plate 14 and the plurality of electronic units 2. The sheets or films 18 and 34 may either define two layers of manufactured cards, or form work sheets that adhere only slightly to the resin and which are subsequently removed without damaging the product thereby obtained. In a conventional manner, in the first variant, printing can be performed on layers 18 and 34 and other films, particularly transparent films, may be placed on either side of plate 40. In the second variant where sheets 18 and 34 define card bodies, the product obtained after the sheets have been removed may either form finished cards, on which a design could be printed, or an intermediate product defining card bodies or cores. Other layers or films are then brought at least on one side of this intermediary product to form a plurality of cards. To obtain individual cards, each card is cut out of the manufactured plate, particularly along a contour made in pierced plate 14, which thus at least partially defines the lateral walls of the cards.

With reference to FIGS. 7 to 10 a second implementation of the method according to the invention will be described below. In this implementation, at least one part of resin 22 is deposited on a sheet or layer 44. Next, the plurality of electronic units is placed on top. In the variant shown, the electronic units are provided in the form of an assembly 42 comprising a pierced plate 14 and a plurality of electronic units 2, which are connected to plate 14 via projecting parts arranged at the periphery of apertures 16 of plate 14. At least one part of the resin is provided in liquid form underneath the plurality of electronic units. According to the invention, this first part of resin 22 is deposited in the form of a first series of resin strings 46 on sheet 44. The resin strings 46 define between them grooves 48, in a similar way to previously described. Next, assembly 42 is deposited on this first series of resin strings. Plate 14 also has lateral tanks 32 for receiving any surplus resin and limiting or stopping the flow of resin along a perpendicular direction to strings 46. As in the first implementation, the resin is deposited in an installation that includes a plurality of nozzles used to form the resin strings. The installation is therefore provided such that the plurality of nozzles and sheet 44 can have a movement between them along direction X relative to the sheet. Upon deposition of the resin on sheet 44, the plurality of nozzles undergoes a movement along that direction X relative to the sheet so as to generate resin strings 46. The strings initially have grooves 48 between them, defining residual air evacuation channels.

Figure 8:
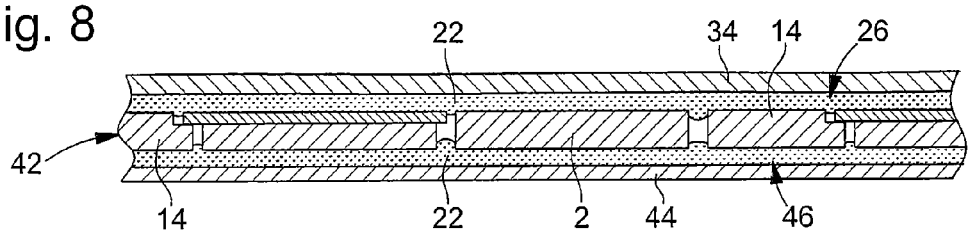
FIG. 8 is a partial cross-section along the line VIII-VIII of FIG. 7 but after additional steps compared to FIG. 7; which is a preferred variant of the second implementation of the method according to the invention.
Figure 9:
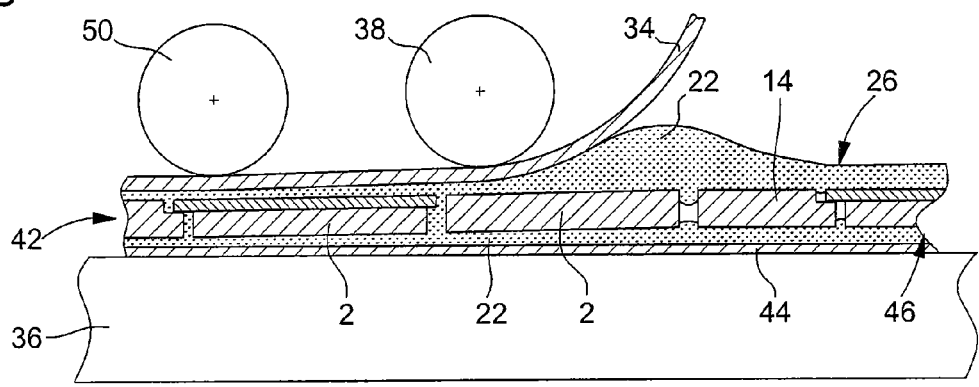
FIG. 9 shows schematically in cross-section the step of spreading the resin strings over all of the elements shown in FIG. 8 using press rollers.
Figure 10:
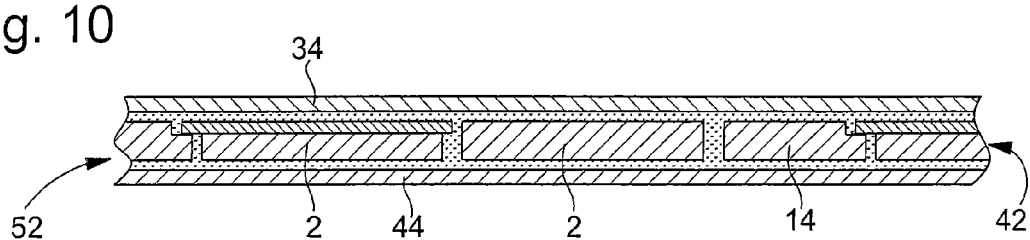
FIG. 10 is a cross-section of the plate obtained in accordance with the method described with reference to FIGS. 8 and 9.

FIGS. 8 to 10 show a preferred variant of the second implementation of the method. In this preferred variant, a second part of the resin is also placed on assembly 42, i.e. onto the electronic units and the pierced plate. Thus, in a similar manner to the first implementation described above, a second series of resin strings 26 is deposited using a plurality of nozzles in a resin deposition installation. It is possible to use the same installation as that used for depositing the first series of resin strings or to provide a second similar installation, particularly in the case of a production line where the electronic units are added onto the first series of resin strings in an intermediate station between the two resin deposition installations. Finally, a top sheet 34 is deposited on the second series of resin strings. The assembly of elements shown in FIG. 8 are brought into an installation fitted with means for spreading resin 22. As was already explained with reference to the first implementation, the spreading means include a press device and are controlled to generate a relative movement, approximately along the direction defined by the resin strings, between the plurality of electronic units 2 and the press device.

Figure 5:
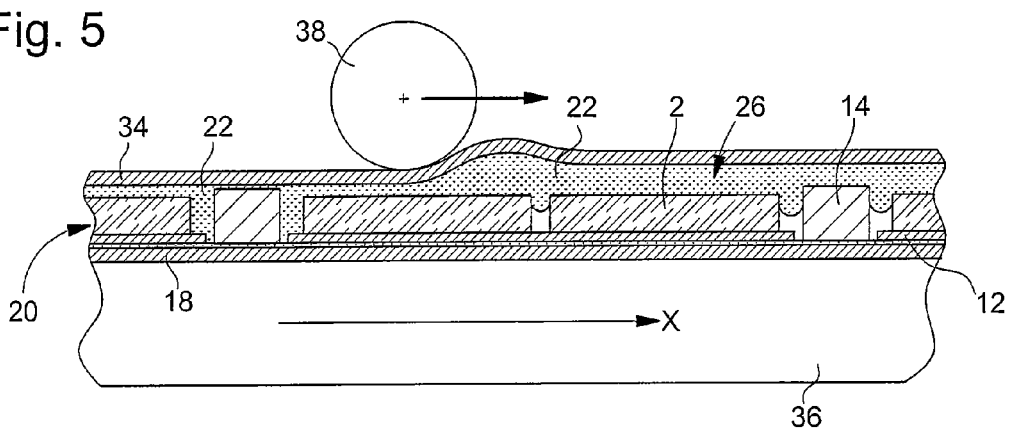
FIG. 5 is a schematic cross-section along the line V-V of FIG. 4.

The device of FIG. 9 essentially differs from that of FIG. 5 in that two press rollers 38 and 50 are provided here. In the variant shown, it will also be noted that the top layer 34 is gradually deposited on the resin strings 26 just before passing underneath rollers 38 and 50. Roller 38 is at greater distance relative to work surface 36, than press roller 50, which follows roller 38. Press roller 38 is thus used to spread resin 22 and fill the various remaining spaces in assembly 42. Roller 50 reduces the thickness of the plate formed and ensures that the resin is spread uniformly to form an approximately flat plate in the area that includes the plurality of electronic units.

Other press devices may be used by those skilled in the art. It is possible, in particular, to use strip presses between which the elements are introduced. By way of example, one could also provide a step of partial solidification, by polymerisation, between press rollers 38 and 50. Finally, the plate 52 obtained after roller 50 may also be placed in a press with flat surfaces until resin 22 has completely solidified. This press is preferably provided without heat provision.

Figure 11:
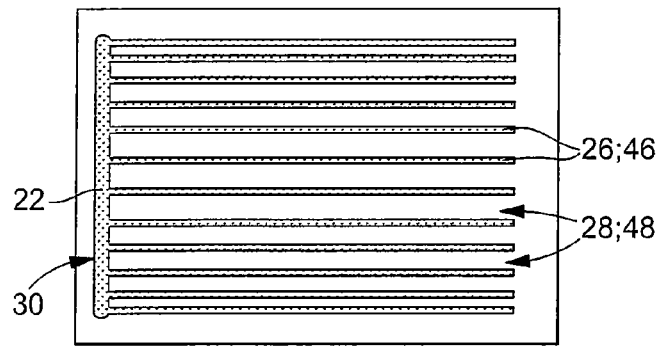
FIGS. 11 to 13 schematically represent three variants of the resin string deposition according to the invention.
Figure 12:
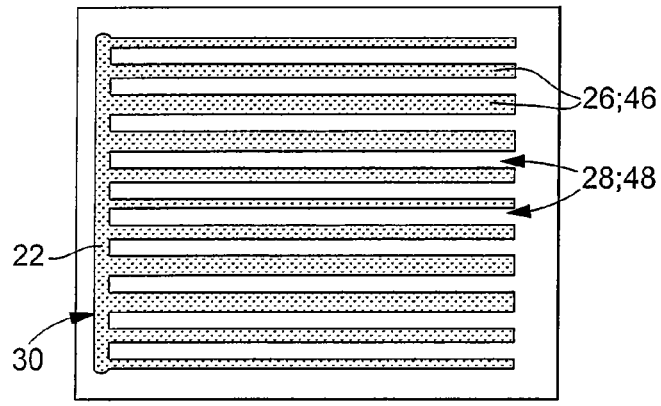
Figure 13:
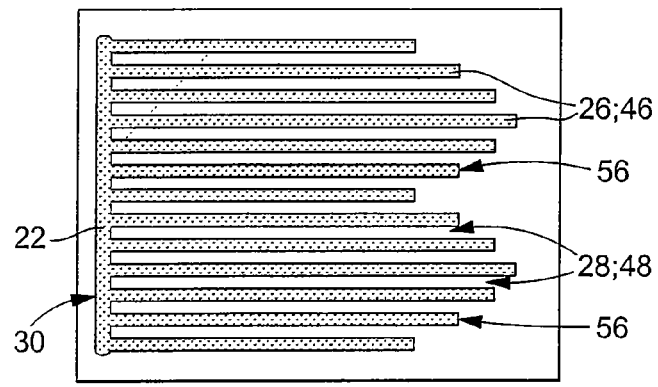

With reference to FIGS. 11 to 13, three variants for depositing the resin in the form of strings will be described below. These Figures are schematic and show only the deposition of the resin on one bottom sheet or layer or on the plurality of electronic units. It will be noted that the method according to the invention may also be applied for providing a resin layer between an intermediate product and a work sheet or an external layer provided on or underneath the intermediate product.

It will be noted here that the variants proposed in FIGS. 11 to 13 have the common objective of minimising resin wastage by optimising the spread of resin in the installation for applying pressure to the resin strings. Within the scope of the present invention, it has been observed that, in the final phase of applying pressure, the resin does not define a wave with a rectilinear front, but generally with a crowned front, i.e. with more resin in the central area than in the two lateral edges of the manufactured plate. This thus results in a waste of resin, given that one has to ensure that the resin is spread uniformly on top of all of the electronic units so as to fill completely the apertures in the pierced plate in which they are arranged. It is thus sought to limit the resin waste on the two lateral sides of the manufactured plate and to obtain a resin front that is as rectilinear as possible at the end of the travel of the press rollers, so as to obtain a last row of cards (to the right of the manufactured plate in the Figures) that has virtually no residual air and whose thickness is the same as the other cards in the preceding rows.

In the variant of FIG. 11, the resin strings 26, respectively 46, have a variable spacing E, i.e. this distance is not the same between at least two pairs of adjacent resin strings. At the left end, corresponding to the end from which the press roller spreads the resin, there is a continuous resin area 30. To obtain a variable spacing between the strings, i.e. grooves of variable width, the plurality of nozzles is arranged to match the spacing between two adjacent nozzles, which are also variable. In the FIG. 12 variant, the spacing between resin strings 26, respectively 46 is approximately constant, however the respective widths of these strings are variable. To obtain strings with variable widths, one need only provide nozzles with apertures of variable width and/or variable flow in the plurality of nozzles. The distribution of the string widths is given here by way of non-limiting example. The width of the external strings is smaller and the width of the other strings is then larger, and this width decreases in the direction of the strings in the central area of the series of strings.

Finally, in FIG. 13, the spacing between resin strings 26, and 46 respectively is approximately constant and the widths of the strings are approximately identical, but the lengths of these resin strings are variable, i.e. each string is deposited over a certain length which depends upon the position of the string concerned in the series of deposited strings. Thus, in this variant, at least two resin strings have different lengths. To achieve this, it is possible to control the supply of resin to each of the nozzles independently or by groups of nozzles used to form strings of the same length. One may also provide nozzles that can have relative movements between them.

Thus, for example, the nozzles are aligned along a straight line at the start of deposition (at the left end in FIG. 13), and then at least some of the nozzles are moved along axis X so as to define together a curve that corresponds to the terminal curve defined by the ends 56 of the deposited strings. One could also imagine a matrix of nozzles with some lines having fewer nozzles than others or a matrix of nozzles fed by group at different periods. Those skilled in the art have several technical possibilities for making a resin deposition installation for implementing the card manufacturing method according to the invention.

Generally, however, the invention relates to a method for manufacturing boards that comprises depositing a liquid resin (22) on and/or under a plurality of electronic units for forming a plate defining a plurality of boards or board bodies. In order to do so, and in order to reduce as much as possible the residual air bubbles in the manufactured plate, the method comprises depositing the resin in the form of resin beads (26) initially having between them grooves (28) defining air discharge channels. The resin is uniformly spread using a pressing roller for one end of the plate to a second opposite end of the plate.

The invention claimed is:

1. A card manufacturing method wherein a plurality of cards or card bodies are made in the form of a plate or strip that includes a plurality of electronic units and a resin that at least partially coats the plurality of electronic units, wherein each card or card body is eventually cut out of the plate or strip, wherein the method includes the steps of:
   (a) providing a plurality of electronic units arranged on a working surface or a sheet;
   (b) depositing at least one part of a resin in liquid form over the plurality of electronic units by a plurality of nozzles in a resin feed installation, wherein during deposition of the at least one part of the resin, the plurality of nozzles undergoes a movement relative to the plurality of electronic units along a first direction so as to generate strings of resin on the plurality of electronic units, wherein each deposited resin string has a length and an end, and wherein the lengths of the resin strings vary so that the ends of the resin strings form a non-rectilinear terminal curve, wherein the resin strings are oriented along the first direction and initially have grooves between these resin strings, wherein the grooves define a plurality of air discharge channels; and
   (c) spreading out the deposited resin by a press device substantially along the first direction in which the resin strings are oriented, wherein the non-rectilinear terminal curve is calculated to produce a substantially rectilinear resin front at the end of a spreading travel of the press device and to minimize resin waste at two lateral sides of the manufactured plate.

2. A card manufacturing method wherein a plurality of cards or card bodies are made in the form of a plate or strip that includes a plurality of electronic units and a resin that at least partially coats the plurality of electronic units, wherein each card or card body is eventually cut out of the plate or strip, wherein the method includes the steps of:
   (a) providing a plurality of electronic units arranged on a working surface or a sheet;
   (b) depositing at least one part of a resin in liquid form over the plurality of electronic units by a plurality of nozzles in a resin feed installation, wherein during deposition of the at least one part of the resin, the plurality of nozzles undergoes a travel movement relative to the plurality of electronic units along a first direction so as to generate strings of resin on the plurality of electronic units, wherein the resin strings are oriented along the first direction and initially have grooves between these resin strings, wherein the grooves define a plurality of air discharge channels, wherein the width of at least two grooves are not equal to provide a plurality of parallel resin strings with grooves of different widths between at least two adjacent pairs of resin strings; and
   (c) spreading out the deposited resin by a press device substantially along the first direction in which the resin strings are oriented, wherein the grooves of different widths between at least two adjacent pairs of resin strings are calculated to produce a substantially rectilinear resin front at the end of a spreading travel of the press device and to minimize resin waste at two lateral sides of the manufactured plate.

3. A card manufacturing method wherein a plurality of cards or card bodies are made in the form of a plate or strip that includes a plurality of electronic units and a resin that at least partially coats the plurality of electronic units, wherein each card or card body is eventually cut out of the plate or strip, wherein the method includes the steps of:
   (a) providing a plurality of electronic units arranged on a working surface or a sheet;
   (b) depositing at least one part of a resin in liquid form over the plurality of electronic units by a plurality of nozzles in a resin feed installation, wherein during deposition of the at least one part of the resin, the plurality of nozzles undergoes a movement relative to the plurality of electronic units along a first direction so as to generate strings of resin on the plurality of electronic units, wherein the width of at least two resin strings vary from each other, wherein the resin strings are oriented along the first direction and initially have grooves between these resin strings, wherein the grooves define a plurality of air discharge channels; and
   (c) spreading out the deposited resin by a press device substantially along the first direction in which the resin strings are oriented, wherein the varied widths of the resin strings are calculated to produce a substantially rectilinear resin front at the end of a spreading travel of the press device and to minimize resin waste at two lateral sides of the manufactured plate.

* * * * *